(12) United States Patent
Bowles et al.

(10) Patent No.: US 9,490,813 B2
(45) Date of Patent: Nov. 8, 2016

(54) HIGH-SPEED LEVEL-SHIFTING MULTIPLEXER

(71) Applicant: QUALCOMM Incorporated, San Diego, CA (US)

(72) Inventors: Kevin Robert Bowles, Mission Viejo, CA (US); Jose Gabriel Corona, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 19 days.

(21) Appl. No.: 14/534,967

(22) Filed: Nov. 6, 2014

(65) Prior Publication Data

US 2016/0134286 A1    May 12, 2016

(51) Int. Cl.
| H03K 7/00 | (2006.01) |
|---|---|
| H03L 5/00 | (2006.01) |
| H03K 19/0185 | (2006.01) |
| H03K 3/356 | (2006.01) |
| H03K 17/00 | (2006.01) |

(52) U.S. Cl.
CPC .. *H03K 19/018507* (2013.01); *H03K 3/35613* (2013.01); *H03K 17/002* (2013.01); *H03K 19/018528* (2013.01)

(58) Field of Classification Search
CPC ........... H03K 3/356113; H03K 3/012; H03K 19/018521; H03K 19/00315
USPC ............. 327/306, 333, 407–410; 326/61–62, 326/80–81
See application file for complete search history.

(56) References Cited

U.S. PATENT DOCUMENTS

| 5,483,489 | A | * | 1/1996 | McClure | ................ | G11C 7/065 365/185.21 |
|---|---|---|---|---|---|---|
| 5,487,048 | A | | 1/1996 | McClure | | |
| 5,789,966 | A | | 8/1998 | Bechade | | |
| 7,319,356 | B1 | * | 1/2008 | Karim | .................. | H03K 17/693 327/333 |
| 7,368,946 | B1 | | 5/2008 | Rahman et al. | | |
| 7,710,183 | B2 | | 5/2010 | Chaba et al. | | |
| 7,764,107 | B2 | * | 7/2010 | Karim | .................. | H03K 17/693 327/287 |
| 7,884,644 | B1 | | 2/2011 | Wu et al. | | |
| 8,558,603 | B2 | | 10/2013 | Hess et al. | | |
| 2005/0052204 | A1 | | 3/2005 | Chun | | |
| 2012/0134439 | A1 | | 5/2012 | Sato et al. | | |
| 2014/0021995 | A1 | | 1/2014 | Zhan et al. | | |

FOREIGN PATENT DOCUMENTS

EP    1276239 A1    1/2003

OTHER PUBLICATIONS

International Search Report and Written Opinion—PCT/US2015/054307—ISA/EPO—May 12, 2016.

* cited by examiner

*Primary Examiner* — Dinh T Le
(74) *Attorney, Agent, or Firm* — Loza & Loza LLP

(57) ABSTRACT

Systems and methods for level-shifting multiplexing are described herein. In one embodiment, a method for level-shifting multiplexing comprises selecting one of a plurality of inputs based on one or more select signals, and pulling down one of first and second nodes based on a logic state of the selected one of the plurality of inputs. The method also comprises pulling up the first node if the second node is pulled down, and pulling up the second node if the first node is pulled down.

27 Claims, 9 Drawing Sheets

HIGH-SPEED LEVEL-SHIFTING MULTIPLEXER

BACKGROUND

1. Field

Aspects of the present disclosure relate generally to level shifters and multiplexers, and more particularly, to level-shifting multiplexers.

2. Background

A chip may comprise different power domains, where each power domain may correspond to a different supply voltage. For example, a first power domain may have a lower supply voltage to reduce the power consumption of circuits in the first power domain, while a second power domain may have a higher supply voltage to increase the performance of circuits in the second power domain. One or more level-shifters may be used to facilitate communication between circuits in different power domains. For example, a level-shifter may allow a signal to cross from one power domain to another power domain by shifting the voltage of the signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a level-shifting multiplexer is described herein. The level-shifting multiplexer comprises a first pull-down circuit coupled to a first node and having first and second inputs, wherein the first pull-down circuit is configured to select one of the first and second inputs based on one or more select signals, to pull down the first node if the first input is selected and driven to a first state, and to pull down the first node if the second input is selected and driven to a second state. The level-shifting multiplexer also comprises a second pull-down circuit coupled to a second node and having third and fourth inputs, wherein the second pull-down circuit is configured to select one of the third and fourth inputs based on the one or more select signals, to pull down the second node if the third input is selected and driven to a third state, and to pull down the fourth node if the fourth input is selected and driven to a fourth state. The level-shifting multiplexer further comprises a pull-up circuit configured to pull up the first node if the second node is pulled down by the second pull-down circuit, and to pull up the second node if the first node is pulled down by the first pull-down circuit.

A second aspect relates to a method for level-shifting multiplexing. The method comprises selecting one of a plurality of inputs based on one or more select signals, and pulling down one of first and second nodes based on a state of the selected one of the plurality of inputs. The method also comprises pulling up the first node if the second node is pulled down, and pulling up the second node if the first node is pulled down.

A third aspect relates to an apparatus for level-shifting multiplexing. The apparatus comprises means for selecting one of a plurality of inputs based on one or more select signals, and means for pulling down one of first and second nodes based on a state of the selected one of the plurality of inputs. The apparatus also comprises means for pulling up the first node if the second node is pulled down, and means for pulling up the second node if the first node is pulled down.

A fourth aspect relates to a multiplexer. The multiplexer comprises a first level-shifting multiplexer configured to select one of a first plurality of inputs based on a first plurality of select signals, to level shift a signal at the selected one of the first plurality of inputs, and to output the level-shifted signal of the first level-shifting multiplexer at a first output. The multiplexer also comprises a second level-shifting multiplexer configured to select one of a second plurality of inputs based on a second plurality of select signals, to level shift a signal at the selected one of the second plurality of inputs, and to output the level-shifted signal of the second level-shifting multiplexer at a second output. The multiplexer further comprises a combining circuit configured to combine the first and second outputs, and a decoder configured to select one of the first and second plurality of inputs based on a pointer by either setting one of the first plurality of select signals to a first state and disabling the second level-shifting multiplexer or setting one of the second plurality of select signals to a second state and disabling the first level-shifting multiplexer.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
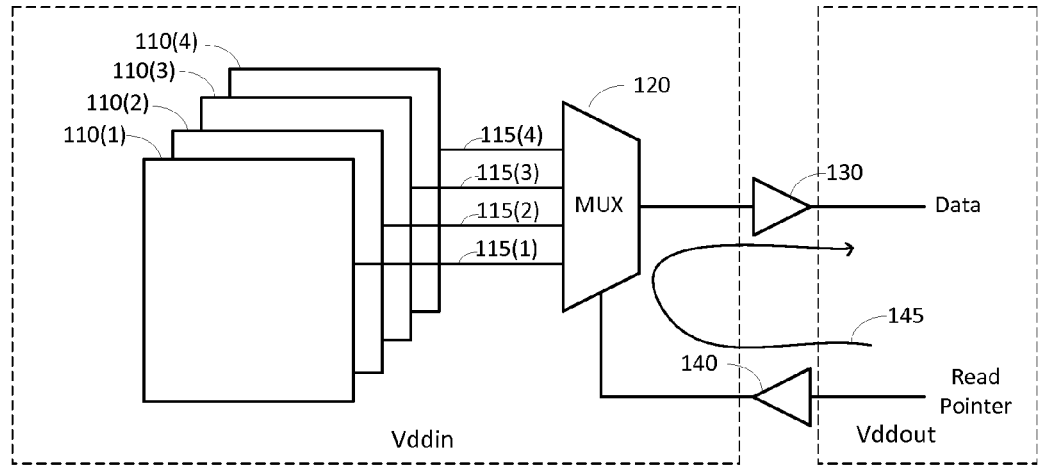
FIG. 1 shows an example of an interface circuit comprising a multiplexer, a level shifter for a read pointer, and a level shifter for the output of the multiplexer.

FIG. 1 shows an interface circuit that may be used to interface an array of storage devices 110(1) to 110(4) (e.g., first-in first-out (FIFO) storage devices) in a first power domain to a receiving circuit (not shown) in a second power domain. The storage devices may also be referred to as buffers, registers or latches. The interface circuit comprises a read multiplexer 120, a first voltage-level shifter 130, and a second voltage-level shifter 140. The supply voltage in the first power domain is Vddin and the supply voltage in the second power domain is Vddout. In this example, the multiplexer 120 is located in the first power domain.

In operation, the multiplexer 120 receives a read pointer from the receiving circuit, and selects the output 115(1) to 115(4) of one of the storage devices 110(1) to 110(4) based on the read pointer. The voltage of the read pointer is level shifted by the second level shifter 140 to enable the read pointer to cross the power domain boundaries from the second power domain to the first power domain. The first level-shifter 130 shifts the voltage of the multiplexer output signal to enable the output signal to cross the power domain boundaries from the first power domain to the second power domain.

A drawback of the interface circuit in FIG. 1 is that the circuit may be unsuitable for operation at high data rates (e.g., 2.5 gigahertz or higher). This is because the power domain boundaries need to be crossed by both the read pointer and the multiplexer output signal in order to read data from a storage device. As a result, the speed with which data can be read from the storage device is reduced. The power domain boundary crossings for a read operation are represented by the path 145 in FIG. 1.

Figure 2:
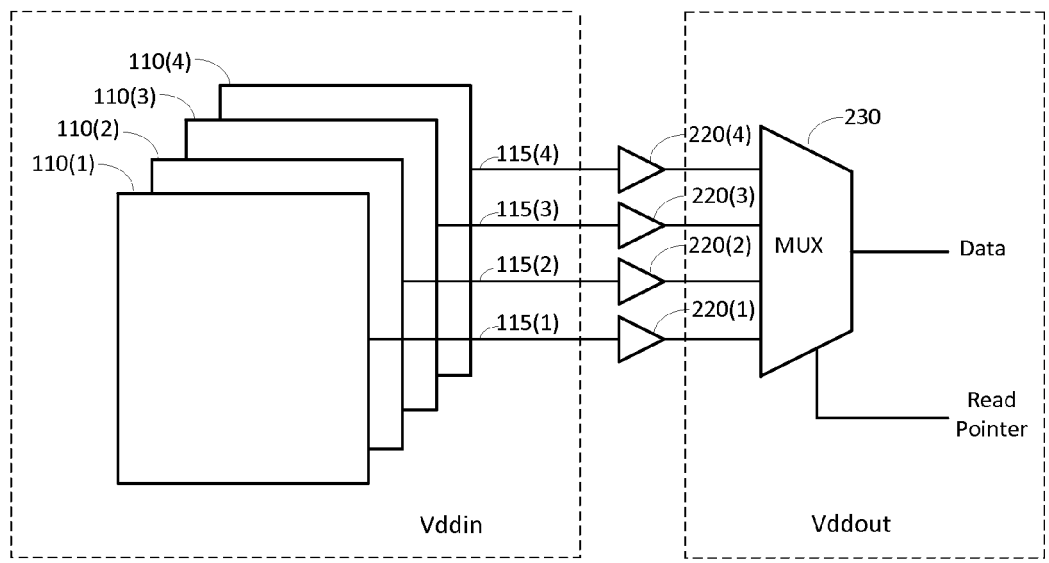
FIG. 2 shows an example of an interface circuit comprising a plurality of level shifters and a multiplexer.

FIG. 2 shows an interface circuit according to another embodiment. In this embodiment, the interface circuit comprises a plurality of level shifters 220(1) to 220(4), and a read multiplexer 230 in the second power domain. Each level shifter 220(1) to 220(4) is coupled to the output 115(1) to 115(4) of a respective one of the storage devices 110(1) to 110(4), and is configured to level shift the voltage of a data signal from the respective one of the storage devices 110(1) to 110(4). This enables the data signal from each storage device to cross the power domain boundaries to the multiplexer 230 in the second power domain. The interface circuit in FIG. 2 mitigates the timing problems associated with the interface circuit in FIG. 1. This is because the read pointer does not need to cross the power domain boundaries since the multiplexer 230 is located in the second power domain. However, the interface circuit in FIG. 2 includes a separate level shifter for each storage device. This substantially increases the area of the interface circuit, especially as the number of storage devices increases.

Figure 3:
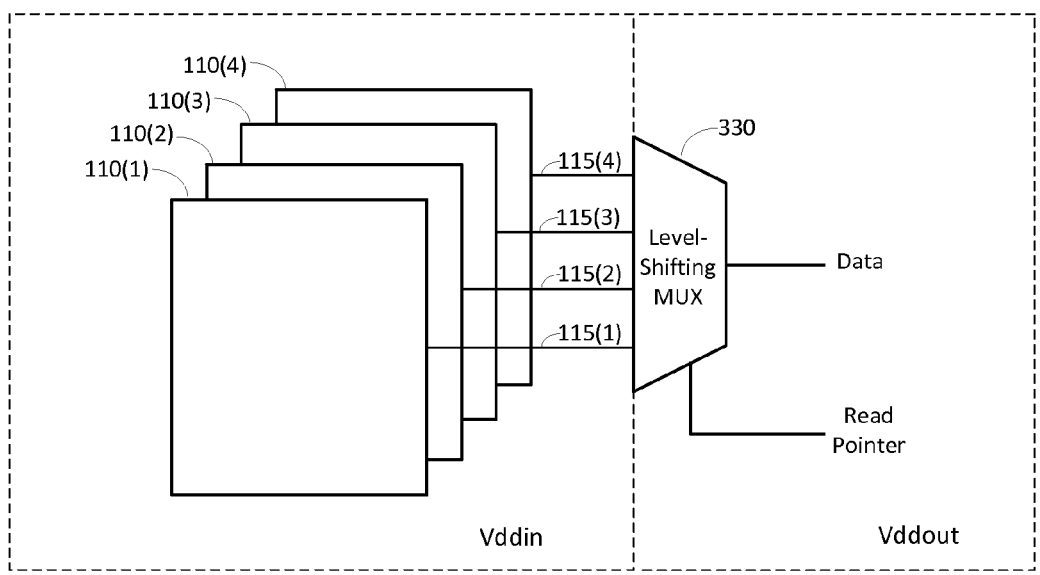
FIG. 3 shows a level-shifting multiplexer according to an embodiment of the present disclosure.

FIG. 3 shows an interface circuit comprising a level-shifting multiplexer 330 according to an embodiment of the present disclosure. The level-shifting multiplexer 330 receives data signals from the storage devices 110(1) to 110(4) in the first power domain, and outputs a selected one of the data signals in the second power domain based on the read pointer. In this embodiment, the level shifting and multiplexing functions are integrated in the level-shifting multiplexer 330. This reduces the area of the interface circuit compared with the interface circuit in FIG. 2. In addition, the level-shifting multiplexer 330 receives the read pointer in the second power domain, thereby mitigating the timing problems associated with the interface circuit in FIG. 1.

Figure 4A:
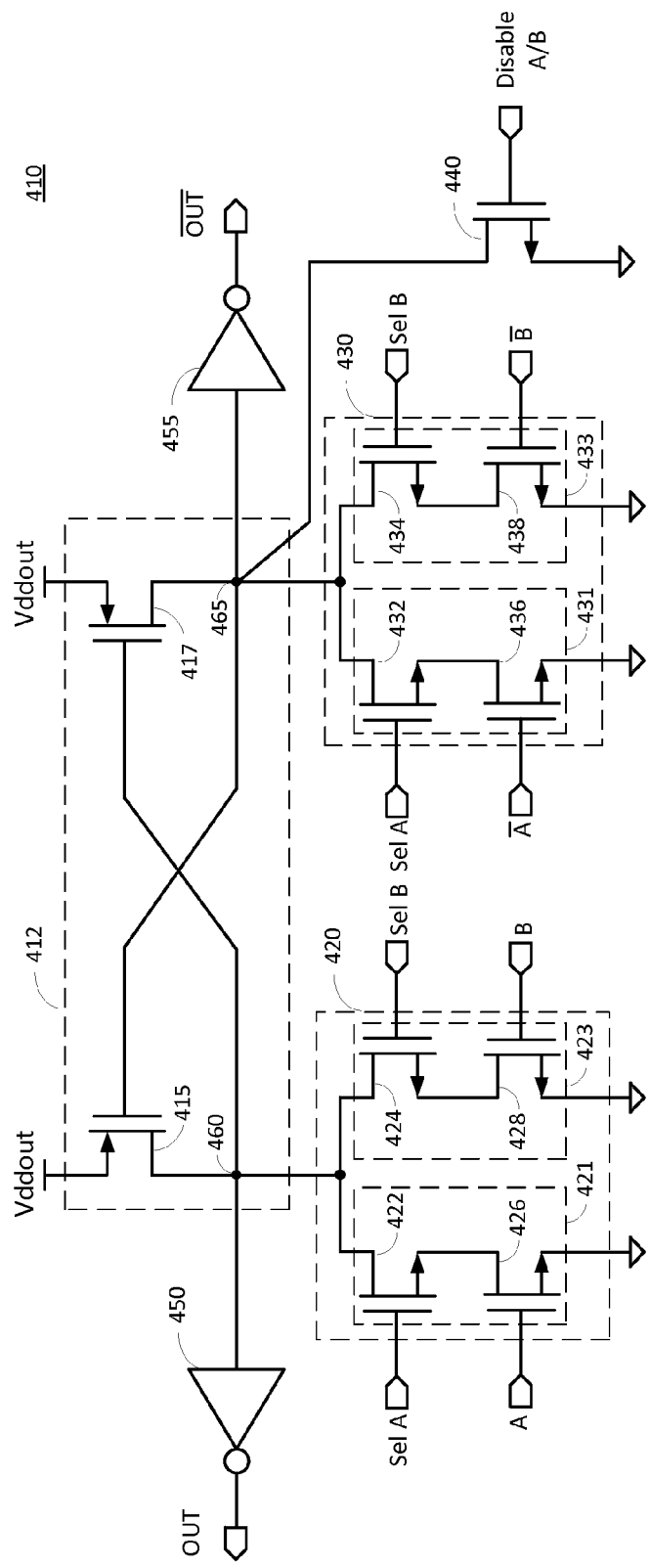
FIG. 4A shows an exemplary implementation of a level-shifting multiplexer according to an embodiment of the present disclosure.

FIG. 4A shows a level-shifting multiplexer 410 according to an embodiment of the present disclosure. The level-shifting multiplexer 410 has a first differential input and a second differential input for receiving a first differential signal and a second differential signal, respectively, in the first power domain. For example, the level-shifting multiplexer 410 may receive the first differential signal from a first one of the storage devices 115(1) and the second differential signal from a second one of the storage devices 115(2). Thus, in the embodiment, the outputs of the storage devices are differential.

The first differential input comprises input A and input $\overline{A}$ for receiving the first differential signal, which comprises signal A and its complement $\overline{A}$ (logical inverse) in the first power domain. The second differential input comprises input B and input $\overline{B}$ for receiving the second differential signal, which comprises signal B and its complement $\overline{B}$ (logic inverse) in the first power domain. Each of the signals A, $\overline{A}$, B and $\overline{B}$ may have a voltage swing of approximately Vddin.

In operation, the level-shifting multiplexer 410 selects either the first differential input (i.e., inputs A and $\overline{A}$) or the second differential input (i.e., inputs B and $\overline{B}$) based on the logic states of select signals Sel A and Sel B received at select inputs Sel A and Sel B, respectively. For example, the level-shifting multiplexer 410 may select the first differential input (i.e., inputs A and $\overline{A}$) if select signal Sel A is logic one and select signal Sel B is logic zero, and select the second differential input (i.e., inputs B and $\overline{B}$) if select signal Sel A is logic zero and select signal Sel B is logic one. The level-shifting multiplexer 410 level shifts the differential signal at the selected differential input and outputs the level-shifted differential signal in the second power domain with a voltage swing of approximately Vddout, as discussed further below. Thus, the voltage of the differential signal at the selected differential input is level shifted from Vddin to Vddout. The logic states of the select signals Sel A and Sel B may be specified by the read pointer shown in FIG. 3 according to the selected storage device. The select signals Sel A and Sel B may be in the second power domain.

The level-shifting multiplexer 410 comprises a pull-up circuit 412, a first pull-down circuit 420, and a second pull-down circuit 430. The pull-up circuit 412 comprises cross-coupled p-type metal-oxide-semiconductor (PMOS) transistors 415 and 417. The sources of the PMOS transistors 415 and 417 are coupled to the supply rail Vddout of the second power domain. The gate of each PMOS transistor 415 and 417 is coupled to the drain of the other PMOS transistor 415 and 417. The drain of PMOS transistor 415 is coupled to node 460, and the drain of PMOS transistor 417 is coupled to node 465.

The first pull-down circuit 420 comprises a first branch 421 and a second branch 423. The first branch 421 comprises a first select n-type metal-oxide-semiconductor (NMOS) transistor 422 and a first drive NMOS transistor 426 coupled in series. The gate of the first select NMOS transistor 422 is coupled to select input Sel A, and the gate of the first drive NMOS transistor 426 is coupled to input A. The drain of the first select NMOS transistor 422 is coupled to node 460, the source of the first select NMOS transistor 422 is coupled to the drain of the first drive NMOS transistor 426, and the source of the first drive NMOS transistor 426 is coupled to ground. The second branch 423 comprises a second select NMOS transistor 424 and a second drive NMOS 428 coupled in series. The gate of the second select NMOS transistor 424 is coupled to select input Sel B, and the gate of the second drive NMOS transistor 428 is coupled to input B. The drain of the second select NMOS transistor 424 is coupled to node 460, the source of the second select NMOS transistor 424 is coupled to the drain of the second drive NMOS transistor 428, and the source of the second drive NMOS transistor 428 is coupled to ground.

The second pull-down circuit 430 comprises a third branch 431 and a fourth branch 433. The third branch 431 comprises a third select NMOS transistor 432 and a third drive NMOS transistor 436 coupled in series. The gate of the third select NMOS transistor 432 is coupled to select input Sel A, and the gate of the third drive NMOS transistor 436 is coupled to input $\overline{A}$. The drain of the third select NMOS transistor 432 is coupled to node 465, the source of the third select NMOS transistor 432 is coupled to the drain of the third drive NMOS transistor 436, and the source of the third drive NMOS transistor 436 is coupled to ground. The fourth branch 433 comprises a fourth select NMOS transistor 434 and a fourth drive NMOS 438 coupled in series. The gate of the fourth select NMOS transistor 434 is coupled to select input Sel B, and the gate of the fourth drive NMOS transistor 438 is coupled to input $\overline{B}$. The drain of the fourth select NMOS transistor 434 is coupled to node 465, the source of the fourth select NMOS transistor 434 is coupled to the drain of the fourth drive NMOS transistor 438, and the source of the fourth drive NMOS transistor 438 is coupled to ground.

The level-shifting multiplexer 410 also comprises a first inverter 450, a second inverter 455, and a clamp transistor 440. The first inverter 450 has an input coupled to node 460 and an output coupled to a first output (denoted "OUT") of the level-shifting multiplexer 410. The second inverter 455 has an input coupled to node 465 and an output coupled to a second output (denoted "$\overline{OUT}$") of the level-shifting multiplexer 410. Both the first and second inverters 450 and 455 may be powered by the supply voltage Vddout of the second power domain. The clamp transistor 440 may be used to disable the level-shifting multiplexer 410 by pulling node 465 to ground, as discussed further below.

In operation, when select signal Sel A is logic one and select signal Sel B is logic zero, the first and third select NMOS transistors 422 and 432 are turned on and the second and fourth select NMOS transistors 424 and 434 are turned off. As a result, the first and third drive NMOS transistors 426 and 436 are coupled to nodes 460 and 465, respectively, and the second and fourth drive NMOS transistors 428 and 438 are decoupled from nodes 460 and 465, respectively. In other words, inputs A and $\overline{A}$ are selected.

If signal A is logic one, then the first drive NMOS transistor 426 is turned on, and pulls node 460 to ground. Since the gate of PMOS transistor 417 is coupled to node 460, this causes PMOS transistor 417 to turn on, and pull up node 465 to Vddout. As a result, the first inverter 450 (which is coupled to node 460) outputs a logic one at the first output OUT of the level-shifting multiplexer 410, and the second inverter 455 (which is coupled to node 465) outputs a logic zero at the second output $\overline{OUT}$ of the level-shifting multiplexer 410.

If signal A is logic zero, then the third drive NMOS transistor 436 (which is driven by the inverse signal $\overline{A}$) is turned on, and pulls node 465 to ground. Since the gate of PMOS transistor 415 is coupled to node 465, this causes PMOS transistor 415 to turn on, and pull up node 460 to Vddout. As a result the first inverter 450 (which is coupled to node 460) outputs a logic zero at the first output OUT of the level-shifting multiplexer 410, and the second inverter 455 (which is coupled to node 465) outputs a logic one at the second output $\overline{OUT}$ of the level-shifting multiplexer 410.

When select signal Sel A is logic zero and select signal Sel B is logic one, the second and fourth select NMOS transistors 424 and 434 are turned on and the first and third select NMOS transistors 422 and 432 are turned off. As a result, the second and fourth drive NMOS transistors 428 and 438 are coupled to nodes 460 and 465, respectively, and the first and third drive NMOS transistors 426 and 436 are decoupled from nodes 460 and 465, respectively. In other words, inputs B and $\overline{B}$ are selected.

If signal B is logic one, then the second drive NMOS transistor 428 is turned on, and pulls node 460 to ground. Since the gate of PMOS transistor 417 is coupled to node 460, this causes PMOS transistor 417 to turn on, and pull up node 465 to Vddout. As a result, the first inverter 450 (which is coupled to node 460) outputs a logic one at the first output OUT of the level-shifting multiplexer 410, and the second inverter 455 (which is coupled to node 465) outputs a logic zero at the second output $\overline{OUT}$ of the level-shifting multiplexer 410.

If signal B is logic zero, then the fourth drive NMOS transistor 438 (which is driven by the inverse signal $\overline{B}$) is turned on, and pulls node 465 to ground. Since the gate of PMOS transistor 415 is coupled to node 465, this causes PMOS transistor 415 to turn on, and pull up node 460 to Vddout. As a result the first inverter 450 (which is coupled to node 460) outputs a logic zero at the first output OUT of the level-shifting multiplexer 410, and the second inverter 455 (which is coupled to node 465) outputs a logic one at the second output $\overline{OUT}$ of the level-shifting multiplexer 410.

Thus, the level-shifting multiplexer 410 selects the first differential input (i.e., inputs A and $\overline{A}$) if select signal Sel A is logic one and select signal Sel B is logic zero, and selects the second differential input (i.e., inputs B and $\overline{B}$) if select signal Sel A is logic zero and select signal Sel B is logic one. The level-shifting multiplexer 410 level shifts the differential signal at the selected differential input, and outputs the level-shifted differential signal in the second power domain at the first and second outputs OUT and $\overline{OUT}$.

The clamp transistor 440 (e.g., NMOS transistor) is used to selectively disable the level-shifting multiplexer 410. More particularly, the clamp transistor 440 disables the level-shifting multiplexer 410 when a disable signal (denoted "Disable A/B") is logic one and enables the level-shifting multiplexer 410 when the disable signal is logic zero. When the disable signal is logic one, the clamp transistor 440 is turned on and pulls node 465 to ground. This causes PMOS transistor 415 to turn on and pull node 460 to Vddout. As a result, the first inverter 450 outputs a logic zero at the first output OUT and the second inverter 455 outputs a logic one at the second output $\overline{OUT}$. The clamp transistor 440 may be used to place the level-shifting multiplexer 410 in a known state when the level-shifting multiplexer 410 is not in use (e.g., in a sleep mode). This prevents nodes 460 and 465 from floating to intermediate logic states (e.g., half Vddout) when the level-shifting multiplexer 410 is not in use. When the disable signal is logic zero, the claim transistor 440 is turned off, and the level-shifting multiplexer 410 operates normally as discussed above.

The level-shifting multiplexer 410 reduces area compared to the circuit shown in FIG. 2, in which a separate level shifter is used for each input signal. This is because the level-shifting multiplexer 410 uses a common pull-up circuit 412 for the first and second differential inputs.

Figure 4B:
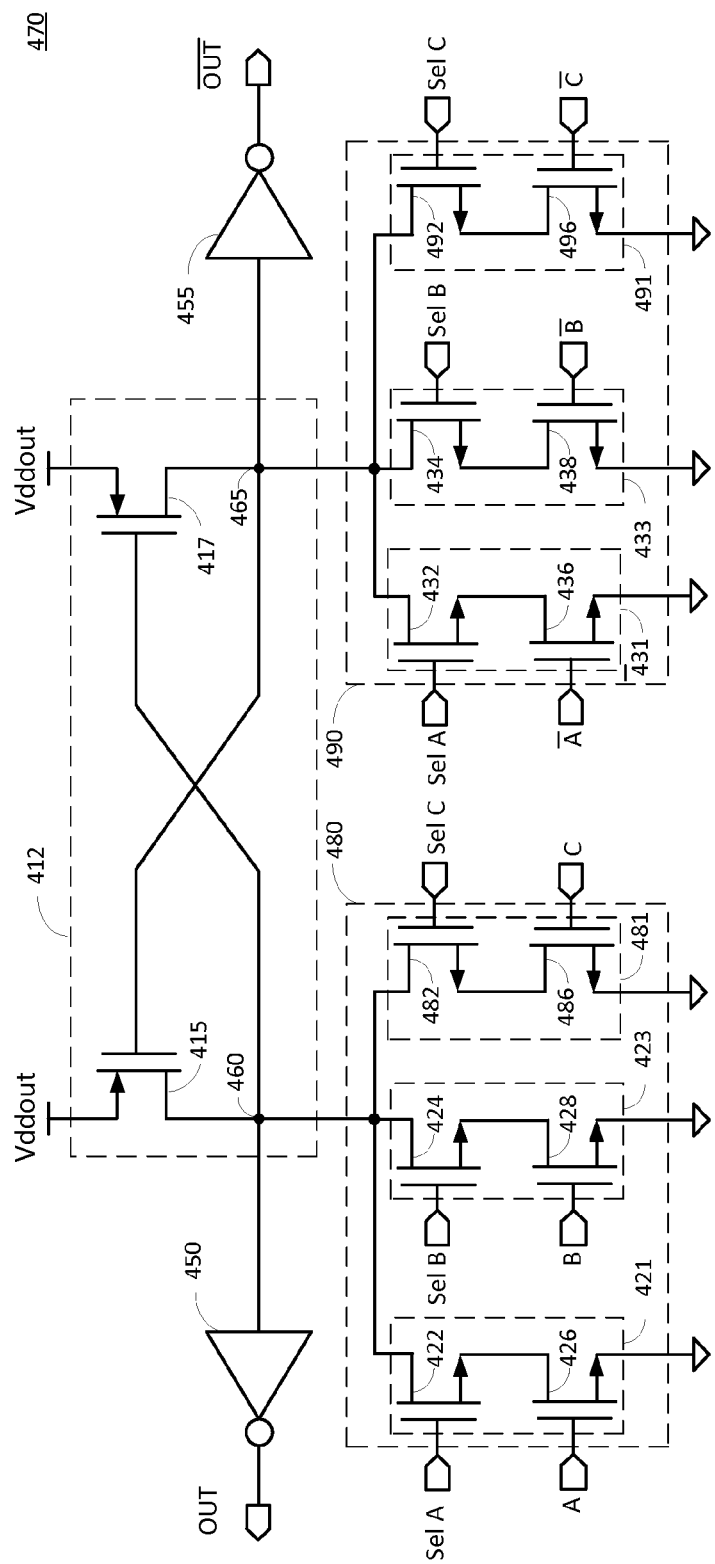
FIG. 4B shows an exemplary implementation of a level-shifting multiplexer according to another embodiment of the present disclosure.

In the example shown in FIG. 4A, the level-shifting multiplexer 410 has two differential inputs. It is to be appreciated that the level-shifting multiplexer 410 is not limited to this example, and that the level-shifting multiplexer 410 may be extended to multiplex more than two differential signals. In this regard, FIG. 4B shows an example in which the level-shifting multiplexer 470 receives a third differential signal (i.e., signal C and its complement $\overline{C}$) in addition to the first and second differential signals discussed above. In this example, the first pull-down circuit 480 includes a fifth branch 481 and the second pull-down circuit 490 includes a sixth branch 491 for the third differential signal (i.e., signals C and $\overline{C}$).

The fifth branch 481 comprises a fifth select NMOS transistor 482 and a fifth drive NMOS transistor 486 coupled in series. The gate of the fifth select NMOS transistor 482 is coupled to select input Sel C, and the gate of the fifth drive NMOS transistor 486 is coupled to input C. The drain of the fifth select NMOS transistor 482 is coupled to node 460, the source of the fifth select NMOS transistor 482 is coupled to the drain of the fifth drive NMOS transistor 486, and the source of the fifth drive NMOS transistor 486 is coupled to ground.

The sixth branch 491 comprises a sixth select NMOS transistor 492 and a sixth drive NMOS 496 coupled in series. The gate of the sixth select NMOS transistor 492 is coupled to select input Sel C, and the gate of sixth drive NMOS transistor 496 is coupled to input $\overline{C}$. The drain of the sixth select NMOS transistor 492 is coupled to node 465, the source of the sixth select NMOS transistor 492 is coupled to the drain of the sixth drive NMOS transistor 496, and the source of the sixth drive NMOS transistor 496 is coupled to ground.

In operation, one of the three differential inputs is selected by setting the corresponding select signal to logic one, and setting the other two select signals to logic zero. For example, if the third differential input (i.e., inputs C and $\overline{C}$) is selected, then select signal Sel C is set to logic one and the select signals Sel A and Sel B are set to logic zero. This causes the fifth and sixth select NMOS transistors 482 and 492 to turn on, and the first, second, third and fourth select NMOS transistors 422, 424, 432 and 434 to turn off. As a result, the fifth and sixth drive NMOS transistors 486 and 496 are coupled to nodes 460 and 465, respectively, with the other drive transistors decoupled from nodes 460 and 465. In other words, inputs C and $\overline{C}$ are selected.

If signal C is logic one, then the fifth NMOS transistor 486 is turned on, and pulls node 460 to ground. This causes PMOS transistor 417 to turn on, and pull up node 465 to Vddout. As a result, the first inverter 450 (which is coupled to node 460) outputs a logic one at the first output OUT, and the second inverter 455 (which is coupled to node 465) outputs a logic zero at the second output $\overline{OUT}$. If signal C is logic zero, then the sixth NMOS transistor 496 (which is driven by the inverse signal $\overline{C}$) is turned on, and pulls node 465 to ground. This causes PMOS transistor 415 to turn on, and pull up node 460 to Vddout. As a result, the first inverter 450 (which is coupled to node 460) outputs a logic zero at the first output OUT, and the second inverter 455 (which is coupled to node 465) outputs a logic one at the second output $\overline{OUT}$.

The level-shifting multiplexer 470 may be extended to multiplex additional signals by adding a branch for each additional signal in the first pull-down circuit 480 and the second pull-down circuit 490. However, adding additional branch increases the capacitive load at each node 460 and 465, which slows down the multiplexer 470.

Figure 5:
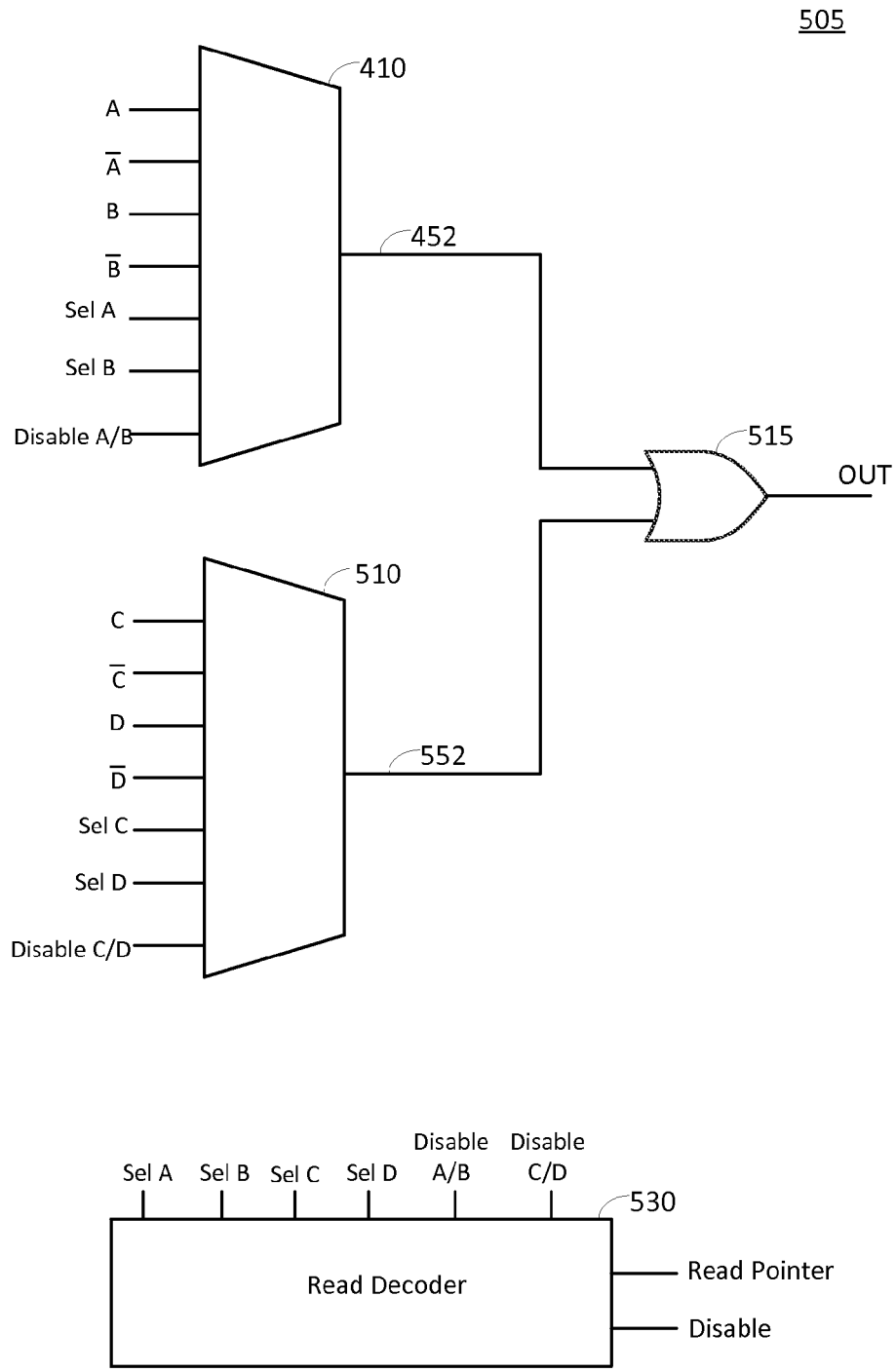
FIG. 5 shows an example of a multiplexer comprising two level-shifting multiplexers according to an embodiment of the present disclosure.

Referring back to FIG. 4A, the level-shifting multiplexer 410 may be combined with one or more other level-shifting multiplexers having the same or similar structure to form a larger level-shifting multiplexer. In this regard, FIG. 5 shows an example in which the level-shifting multiplexer 410 in FIG. 4A is combined with a second level-shifting multiplexer 510 to form a larger level-shifting multiplexer 505. In this example, the second multiplexer 510 may have substantially the same structure as the first multiplexer 410, and may be configured to select either a third differential input (i.e., inputs C and $\overline{C}$) or a fourth differential input (i.e., inputs D and $\overline{D}$) based on select signals Sel C and Sel D. More particularly, the second multiplexer 510 may be implemented by duplicating the structure shown in FIG. 4A, and replacing inputs A, B, $\overline{A}$, $\overline{B}$, Sel A, Sel B and Disable A/B with inputs C, D, $\overline{C}$, $\overline{D}$, Sel C, Sel D and Disable C/D, respectively.

In this embodiment, the positive output 452 of the first multiplexer 410 is coupled to a first input of OR gate 515, and the positive output 552 of the second multiplexer 510 is coupled to a second input of the OR gate 515. In this example, the negative output $\overline{OUT}$ of each multiplexer 410 and 510 is not used. The OR gate 515 is in the second power domain and may be powered by supply voltage Vddout. The output of the multiplexer 505 (denoted "OUT") is taken at the output of the OR gate 515.

In this embodiment, one of the four differential inputs of the multiplexer 505 may be selected at a time. The selection may be controlled by a read decoder 530 that receives the read pointer and controls the logic states of the select signals Sel A, Sel B, Sel C and Sel D, and the disable signals Disable A/D and Disable C/D to select the differential input specified by the read pointer. In this embodiment, the read pointer may have a two-bit value that specifies one of the four differential inputs. For ease of illustration, the individual connections between the multiplexers 410 and 510 and the read decoder 530 are not shown in FIG. 5.

For example, if the first differential input (i.e., inputs A and $\overline{A}$) is selected by the read pointer, then the read decoder 530 may set select signal Sel A to logic one, set select signal Sel B to logic zero, and set disable signal Disable C/D to logic one. This causes the first multiplexer 410 to select the first differential input (i.e., inputs A and $\overline{A}$) and disables the second multiplexer 510, causing the second multiplexer 510 to output a logic zero at output 552. As a result, the logic state at the output of the OR gate 515 depends on the logic state at the positive output 452 of the first multiplexer 410 (i.e., the logic state of signal A). In this example, disable signal Disable A/B is set to logic zero.

In another example, if the second differential input (i.e., inputs B and $\overline{B}$) is selected by the read pointer, then the read decoder 530 may set select signal Sel B to logic one, set select signal Sel A to logic zero, and set disable signal Disable C/D to logic one. This causes the first multiplexer 410 to select the second differential input (i.e., inputs B and $\overline{B}$) and disables the second multiplexer 510, causing the second multiplexer 510 to output a logic zero at output 552. As a result, the logic state at the output of the OR gate 515 depends on the logic state at the positive output 452 of the first multiplexer 410 (i.e., the logic state of signal B). In this example, disable signal Disable A/B is set to logic zero.

In yet another example, if the third differential input (i.e., inputs C and $\overline{C}$) is selected by the read pointer, then the read decoder 530 may set select signal Sel C to logic one, set select signal Sel D to logic zero, and set disable signal Disable A/B to logic one. This causes the second multiplexer 510 to select the third differential input (i.e., inputs C and $\overline{C}$) and disables the first multiplexer 410, causing the first multiplexer 410 to output a logic zero at output 452. As a result, the logic state at the output of the OR gate 515 depends on the logic state at the positive output 552 of the second multiplexer 510 (i.e., the logic state of signal C). In this example, disable signal Disable C/D is set to logic zero.

In still another example, if the fourth differential input (i.e., inputs D and $\overline{D}$) is selected by the read pointer, then the read decoder 530 may set select signal Sel D to logic one, set select signal Sel C to logic zero, and set disable signal Disable A/B to logic one. This causes the second multiplexer 510 to select the fourth differential input (i.e., inputs D and $\overline{D}$) and disables the first multiplexer 410, causing the first multiplexer 410 to output a logic zero at output 452. As a result, the logic state at the output of the OR gate 515 depends on the logic state at the positive output 552 of the second multiplexer 510 (i.e., the logic state of signal D). In this example, disable signal Disable C/D is set to logic zero.

In general, the read decoder 530 selects one of the four differential inputs by setting the corresponding select signal to logic one and setting the other select signal input to the same multiplexer 410 or 510 to logic zero. The read decoder 530 disables the multiplexer 410 or 510 that does not correspond to the selected differential input by setting the corresponding disable signal to logic one. In other words, the read decoder 530 disables the multiplexer 410 or 510 that does not have any of its differential inputs selected.

Disabling the multiplexer 410 or 510 that does not correspond to the selected differential input forces the positive output 452 or 552 of the multiplexer to logic zero. As a result, the logic state at the output OUT of the OR gate 515 depends on the logic state at the positive output 452 or 552 of the multiplexer 410 or 510 corresponding to the selected differential input. Thus, the clamp transistor 440 in each multiplexer 410 and 510 is used to disable the multiplexer 410 or 510 that does not correspond to the selected differential input.

When the entire multiplexer 505 is to be disabled (e.g., in a sleep mode), then the read decoder 530 may set both disable signals Disable A/B and Disable C/D to logic one. This causes the multiplexer 505 to output logic zero at the output OUT of the OR gate 515. In this aspect, the read decoder 530 may receive a disable signal and disable the multiplexer 505 when the disable signal is logic one. Thus, the clamp transistor 440 in each of the multiplexers 410 and 510 may serve two functions: disable the respective multiplexer 410 or 510 when the respective multiplexer 410 or 510 does not correspond to the selected differential input, and disable the respective multiplexer when the entire multiplexer 505 is to be disabled (e.g., in a sleep mode).

Figure 6:
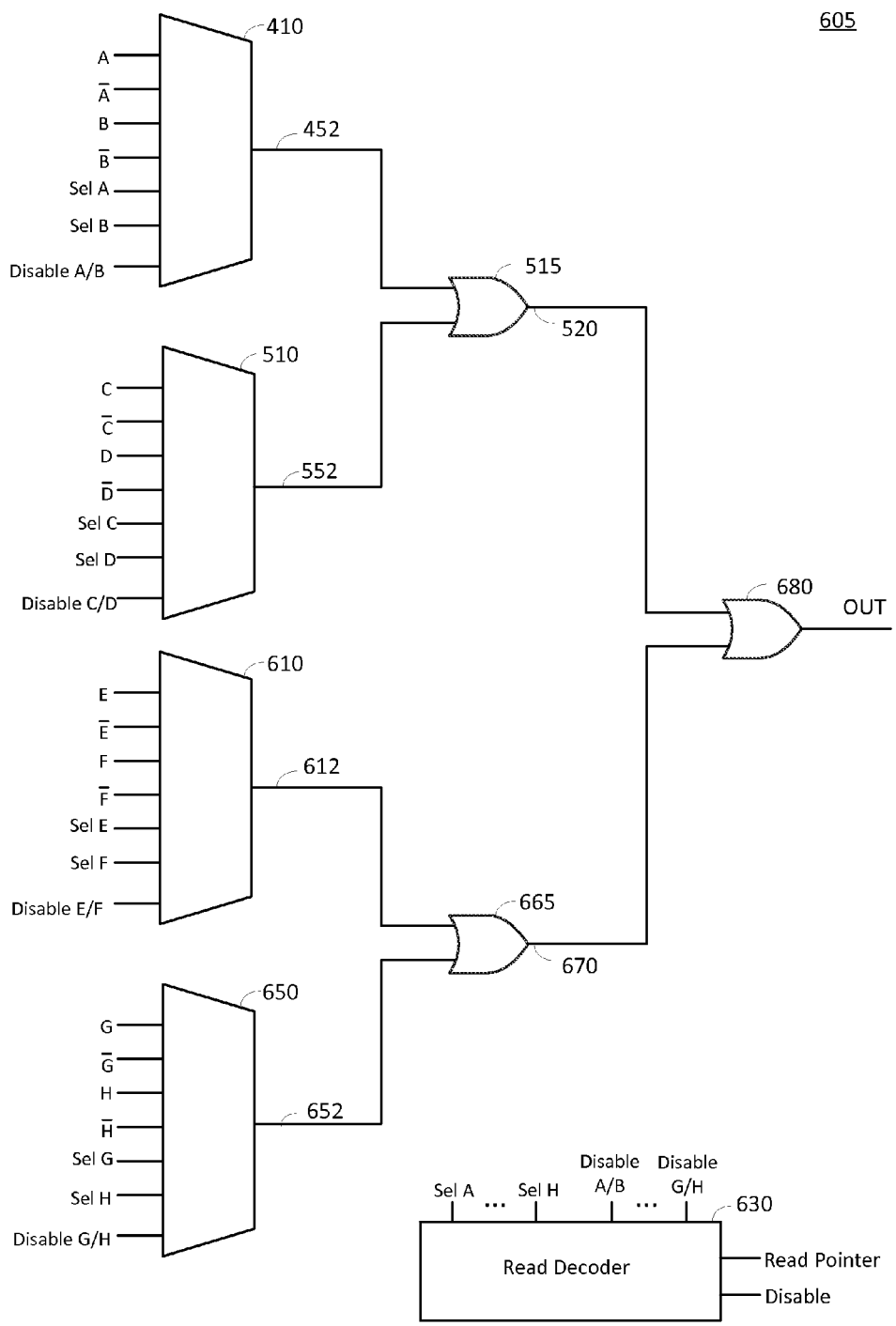
FIG. 6 shows an example of a multiplexer comprising four level-shifting multiplexers according to an embodiment of the present disclosure.

The level-shifting multiplexers 410 and 510 in FIG. 5 may be combined with one or more additional level-shifting multiplexers to form an even larger multiplexer. In this regard, FIG. 6 shows an example in which the first and second level-shifting multiplexers 410 and 510 are combined with third and fourth level-shifting multiplexers 610 and 650 to form an eight differential input multiplexer 605. Each of the third and fourth multiplexers 610 and 650 may have substantially the same structure as the first multiplexer 410 shown in FIG. 4A.

The third multiplexer 610 may be configured to select either a fifth differential input (i.e., inputs E and $\overline{E}$) or a sixth differential input (i.e., inputs F and $\overline{F}$) based on select signals Sel E and Sel F. More particularly, the third multiplexer 610 may be implemented by duplicating the structure shown in FIG. 4A, and replacing inputs A, B, $\overline{A}$, $\overline{B}$, Sel A, Sel B and Disable A/B with inputs E, F, $\overline{E}$, $\overline{F}$, Sel E, Sel F and Disable E/F, respectively.

The fourth multiplexer 650 may be configured to select either a seventh differential input (i.e., inputs G and $\overline{G}$) or an eighth differential input (i.e., inputs H and $\overline{H}$) based on select signals Sel G and Sel H. More particularly, the fourth multiplexer 650 may be implemented by duplicating the structure shown in FIG. 4A, and replacing inputs A, B, $\overline{A}$, $\overline{B}$, Sel A, Sel B and Disable A/B with inputs G, H, $\overline{G}$, $\overline{H}$, Sel G, Sel H and Disable G/H, respectively.

In this embodiment, the positive output 612 of the third multiplexer 610 is coupled to a first input of a second OR gate 665, and the positive output 652 of the fourth multiplexer 650 is coupled to a second input of the second OR gate 665. The output 520 of the first OR gate 515 is coupled to a first input of a third OR gate 680 and the output 670 of the second OR gate 665 is coupled to a second input of the third OR gate. The output of the multiplexer 605 is taken at the output (denoted "OUT") of the third OR gate 680.

In this embodiment, one of the eight differential inputs of the level-shifting multiplexer 605 may be selected at a time. The selection may be controlled by the read decoder 630, which receives the read pointer and controls the logic states of the select signals Sel A to Sel H and the disable signals Disable A/D to Disable G/H to select the differential input specified by the read pointer. In this embodiment, the read pointer may have a three-bit value that specifies one of the eight differential inputs. For ease of illustration, the individual connections between the multiplexers 410, 510, 610 and 650 and the read decoder 630 are not shown in FIG. 6.

In operation, the read decoder 630 selects one of the eight differential inputs by setting the corresponding select signal to logic one and setting the other select signal input to the same multiplexer 410, 510, 610 or 650 to logic zero. The read decoder 530 disables the other three multiplexers that do not correspond to the selected differential input by setting the corresponding disable signals to logic one. This causes the other three multiplexers to output a logic zero so that the logic state at the output OUT of the third OR gate 680 (and hence the multiplexer 605) depends on the logic state at the output of the multiplexer 410, 510, 610 or 650 corresponding to the selected differential input.

For example, if the eighth differential input (i.e., inputs H and $\overline{H}$) is selected by the read pointer, then the read decoder 630 may set select signal Sel H to logic one, set select signal Sel G to logic zero, and set disable signals Disable A/B, Disable C/D and Disable E/F to logic one. In another example, if the fifth differential input (i.e., inputs E and $\overline{E}$) is selected by the read pointer, then the read decoder 630 may set select signal Sel E to logic one, set select signal Sel F to logic zero, and set disable signals Disable A/B, Disable C/D and Disable G/H to logic one.

When the entire multiplexer 605 is to be disabled (e.g., in a sleep mode), then the read decoder 530 may set all of the disable signals Disable A/B to Disable G/H to logic one. This causes the multiplexer 605 to output logic zero at the output OUT of the third OR gate 680. In this aspect, the read decoder 630 may receive a disable signal and disable the multiplexer 605 when the disable signal is logic one.

Thus, multiple level-shifting multiplexers may be combined to realize larger multiplexers by ORing the outputs of the multiple level-shifting multiplexers. FIG. 5 shows an example in which two level-shifting multiplexers 410 and 510 are combined using OR gate 515 to form a multiplexer 505 capable of multiplexing four different signals. FIG. 6 shows an example in which four level-shifting multiplexers 410, 510, 610 and 650 are combined using OR gates 515, 665 and 680 to form a multiplexer 605 605 capable of multiplexing eight differential signals.

Figure 7:
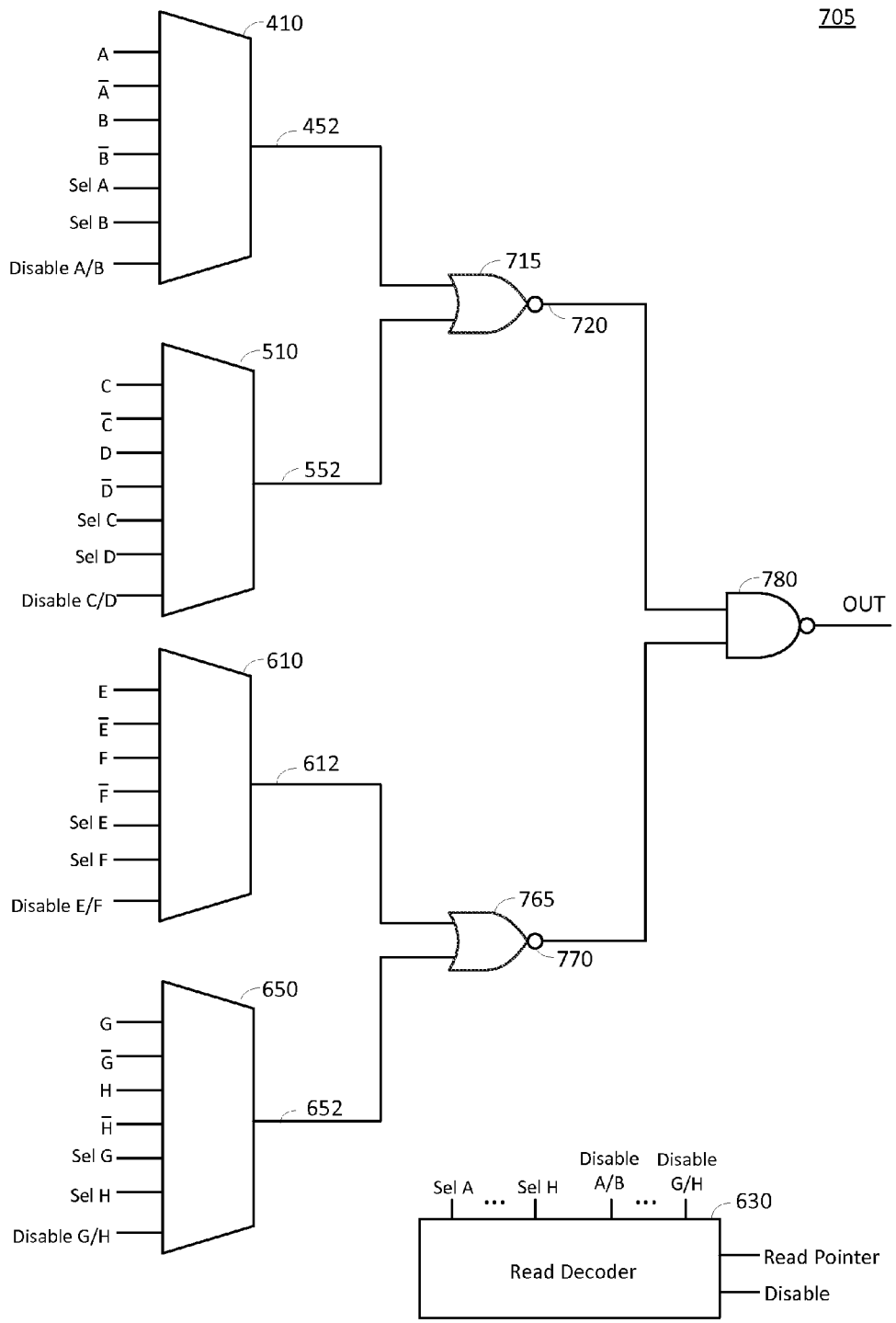
FIG. 7 shows an example of a multiplexer comprising four level-shifting multiplexers according to another embodiment of the present disclosure.

It is to be appreciated that the outputs of the multiple level-shifting multiplexers may be ORed using different types of logic gates. In this regard, FIG. 7 shows an example of a multiplexer 705 in which the first OR gate 515 is replaced by a first NOR gate 715, the second OR gate 665 is replaced with a second NOR gate 765, and the third OR gate 680 is replaced with a NAND gate 780. The combination of the NOR gates 715 and 765 and the NAND gate 780 may be logically equivalent to the combination of the OR gates 515, 665 and 680 in FIG. 6. In this example, the positive outputs 452 and 552 of the first and second multiplexers 410 and 510 are input to the first NOR gate 715 and the positive outputs 612 and 652 of the third and fourth multiplexers 610 and 650 are input to the second NOR gate 765. The outputs 720 and 770 of the first and second NOR gates 715 and 765 are input to the NAND gate 780, and the output (denoted "OUT") of the multiplexer 705 is taken at the output of the NAND gate 780.

Referring back to FIG. 4A, the level-shifting multiplexer 410 may be limited in the amount by which the supply voltage Vddin of the first power domain can differ from the supply voltage Vddout of the second power domain. This may be explained by way of the following example in which the first differential input (i.e., inputs A and $\overline{A}$) is selected.

When signal A transitions from zero to one, the first drive NMOS transistor 426 turns on and tries to pull node 460 to ground. However, PMOS transistor 415 of the pull-up circuit 412 may still be turned on and therefore fight (resist) the attempt by the first drive NMOS transistor 426 to pull node 460 to ground. As the difference between Vddout and Vddin increases, it becomes increasingly harder for the first drive NMOS transistor 426 (which is driven by Vddin) to pull down node 460. Therefore, the multiplexer may cease to function properly if the difference between Vddin and Vddout becomes too large.

Figure 8:
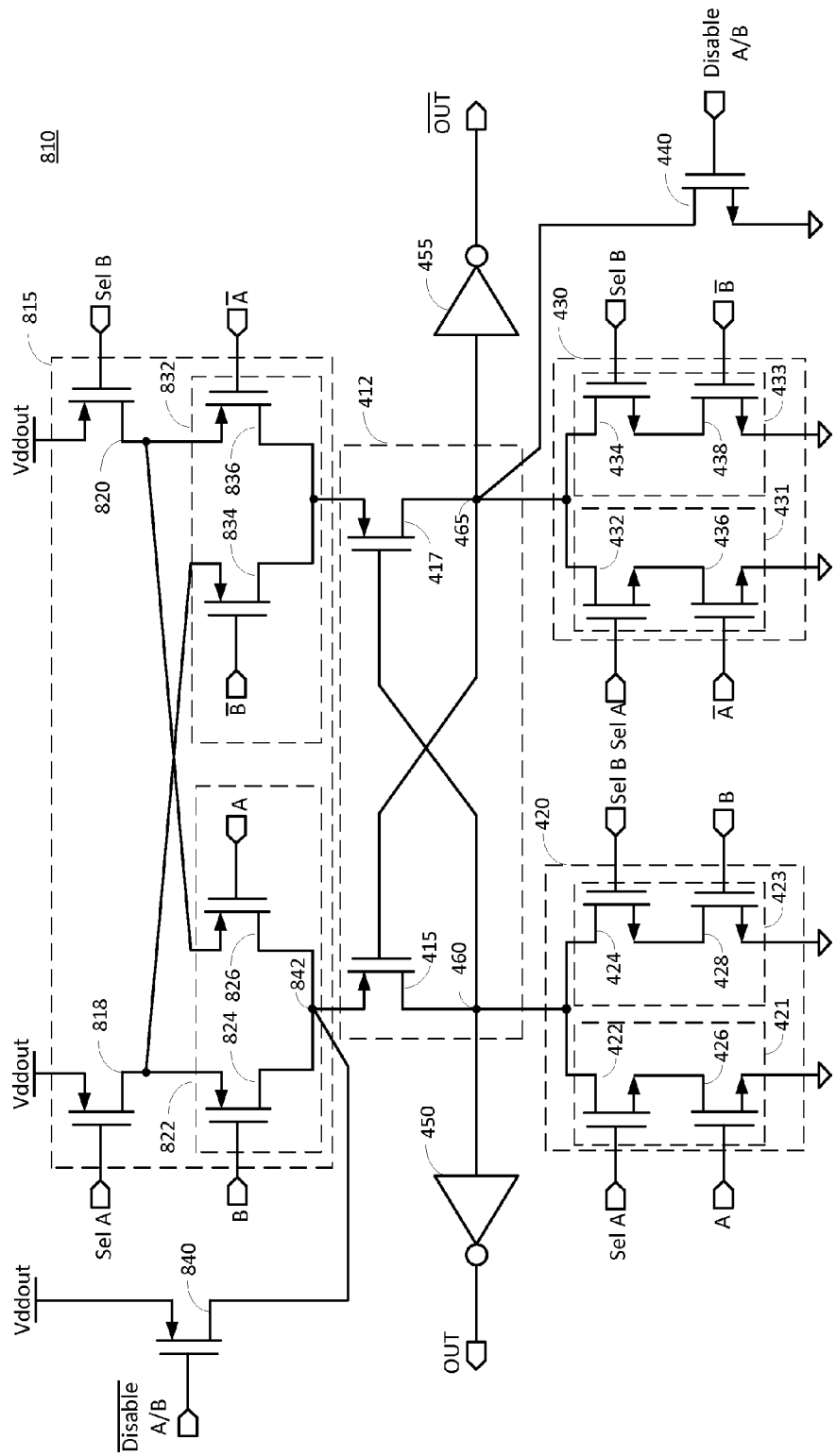
FIG. 8 shows a level-shifting multiplexer comprising a multiplexing choke circuit according to an embodiment of the present disclosure.

In this regard, FIG. 8 shows a level-shifting multiplexer 810 according to an embodiment of the present disclosure that is able operate over a wider range of supply voltages. The level-shifting multiplexer 810 comprises the level-shifting multiplexer 410 in FIG. 4A and a multiplexing choke circuit 815 coupled to the sources of the PMOS transistors 415 and 417 of the pull-up circuit 412. The multiplexing choke circuit 815 allows the difference between Vddin and Vddout to be larger compared with the multiplexer 410 alone, as explained further below.

The multiplexing choke circuit 815 comprises a first select PMOS transistor 818, a second select PMOS transistor 820, a first choke circuit 822, and a second choke circuit 832. The gate of the first select PMOS transistor 818 is coupled to select input A, and the gate of the second select PMOS transistor 820 is coupled to select input Sel B.

The first choke circuit 822 comprises a first choke PMOS transistor 824 and a second choke PMOS transistor 826. The first choke PMOS transistor 824 is coupled between the first select PMOS transistor 818 and PMOS transistor 415 of the pull-up circuit 412. The second PMOS transistor 826 is coupled between the second select PMOS transistor 820 and PMOS transistor 415 of the pull-up circuit 412. The gate of the first choke PMOS transistor 824 is coupled to input B, and the gate of the second choke PMOS transistor 826 is coupled to input A.

The second choke circuit 832 comprises a third choke PMOS transistor 834 and a fourth choke PMOS transistor 836. The third choke PMOS transistor 834 is coupled between the first select PMOS transistor 818 and PMOS transistor 417 of the pull-up circuit 412, and the fourth choke PMOS transistor 836 is coupled between the second select PMOS transistor 820 and PMOS transistor 417 of the pull-up circuit 412. The gate of the third choke PMOS transistor 834 is coupled to input $\overline{B}$, and the gate of the fourth choke PMOS transistor 836 is coupled to input $\overline{A}$.

As discussed above, the multiplexing choke circuit 815 allows the difference between Vddout and Vddin to be larger compared with the level-shifting multiplexer 410 alone. This may be explained by way of the following examples.

When select signal Sel A is logic one and select signal Sel B is logic zero, the first select transistor 818 is turned off and the second select transistor 820 is turned on. As a result, the second and fourth choke PMOS transistors 826 and 836 are coupled to the supply rail Vddout of the second power domain, and the first and second choke PMOS transistors 824 and 834 are decoupled from the supply rail Vddout of the second power domain. In other words, the choke PMOS transistors 826 and 836 corresponding to the first different input (i.e., inputs A and $\overline{A}$) are selected when the first differential input is selected.

In this example, when signal A transitions from zero to one, the first choke circuit 822 helps the first drive NMOS transistor 426 pull down node 460 by choking off current from Vddout to PMOS transistor 415 of the pull-up circuit 412. This is because the logic one of signal A turns off (or partial turns off) the second choke PMOS transistor 826, thereby reducing (choking) current from Vddout to PMOS transistor 415 through the second choke PMOS transistor 826. As a result, the ability of PMOS transistor 415 to fight (resist) the attempt of the first drive transistor 426 to pull down node 460 is diminished. This allows the difference between Vddout and Vddin to be greater compared with the multiplexer 410 in FIG. 4A. Current does not flow from the supply rail Vddout to PMOS transistor 415 through the first choke PMOS transistor 824 since the first select PMOS transistor 818 is turned off In this example, when signal A transitions from one to zero, the fourth choke circuit 836 helps the third drive NMOS transistor 436 pull down node 465 by choking off current from Vddout to PMOS transistor 417 of the pull-up circuit 412. This is because the inverse signal $\overline{A}$ is logic one and the logic one of signal $\overline{A}$ turns off (or partial turns off) the fourth choke PMOS transistor 836, thereby reducing (choking) current from Vddout to PMOS transistor 417 through the fourth choke PMOS transistor 836. Current does not flow from the supply rail Vddout to PMOS transistor 417 through the third choke PMOS transistor 834 since the first select PMOS transistor 818 is turned off.

When select signal Sel A is logic zero and select signal Sel B is logic one, the first select transistor 818 is turned on and the second select transistor 820 is turned off As a result, the first and third choke PMOS transistors 824 and 834 are coupled to the supply rail Vddout of the second power domain, and the second and fourth PMOS transistors 826 and 836 are decoupled from the supply rail Vddout of the second power domain. In other words, the choke PMOS transistors 824 and 834 corresponding to the second different input (i.e., inputs B and $\overline{B}$) are selected when the second differential input is selected.

In this example, when signal B transitions from zero to one, the first choke circuit 822 helps the second drive NMOS transistor 428 pull down node 460 by choking off current from Vddout to PMOS transistor 415 of the pull-up circuit 412. This is because the logic one of signal B turns off (or partial turns off) the first choke PMOS transistor 824, thereby reducing (choking) current from Vddout to PMOS transistor 415 through the first choke PMOS transistor 824. Current does not flow from the supply rail Vddout to PMOS transistor 415 through the second choke PMOS transistor 826 since the second select PMOS transistor 820 is turned off.

In this example, when signal B transitions from one to zero, the third choke circuit 834 helps the fourth drive NMOS transistor 438 pull down node 465 by choking off current from Vddout to PMOS transistor 417 of the pull-up circuit 412. This is because the inverse signal $\overline{B}$ is logic one and the logic one of signal $\overline{B}$ turns off (or partial turns off) the third choke PMOS transistor 834, thereby reducing (choking) current from Vddout to PMOS transistor 417 through the third choke PMOS transistor 834. Current does not flow from the supply rail Vddout to PMOS transistor 417 through the fourth choke PMOS transistor 836 since the second select PMOS transistor 820 is turned off.

Thus, the multiplexing choke circuit 815 allows the difference between Vddout and Vddin to be larger compared with the level-shifting multiplexer 410 alone. The difference between Vddout and Vddin may be 100 mV or greater, 200 mV or greater, or 300 mV or greater.

The level-shifting multiplexer 810 may also comprise a second clamp transistor 840 (e.g., PMOS transistor), as shown in FIG. 8. The second clamp transistor 840 may have a source coupled to the supply rail Vddout of the second power domain, a drain coupled to the source of PMOS transistor 415 at node 842, and a gate driven by the inverse of the disable signal $\overline{DisableA/B}$. The inverse disable signal may be generated, for example, using an inverter powered by Vddout. In this embodiment, when the disable signal Disable A/B is logic one, the first clamp transistor 440 turns on and pulls node 465 to ground, and the second clamp transistor 840 turns on and pulls node 842 (and hence the source of PMOS transistor 415) to Vddout. PMOS transistor 415 is turned on because node 465 is pulled to ground by the first clamp transistor 440. As a result, PMOS transistor 415 pulls node 460 to approximately Vddout at node 842. The first inverter 450 outputs logic zero at the first output OUT, and the second inverter 455 outputs logic one at the second output $\overline{OUT}$. When the disable signal Disable A/B is logic zero, both clamp transistors 440 and 840 are turned off, and the multiplexer 810 operates normally as discussed above.

Figure 9:
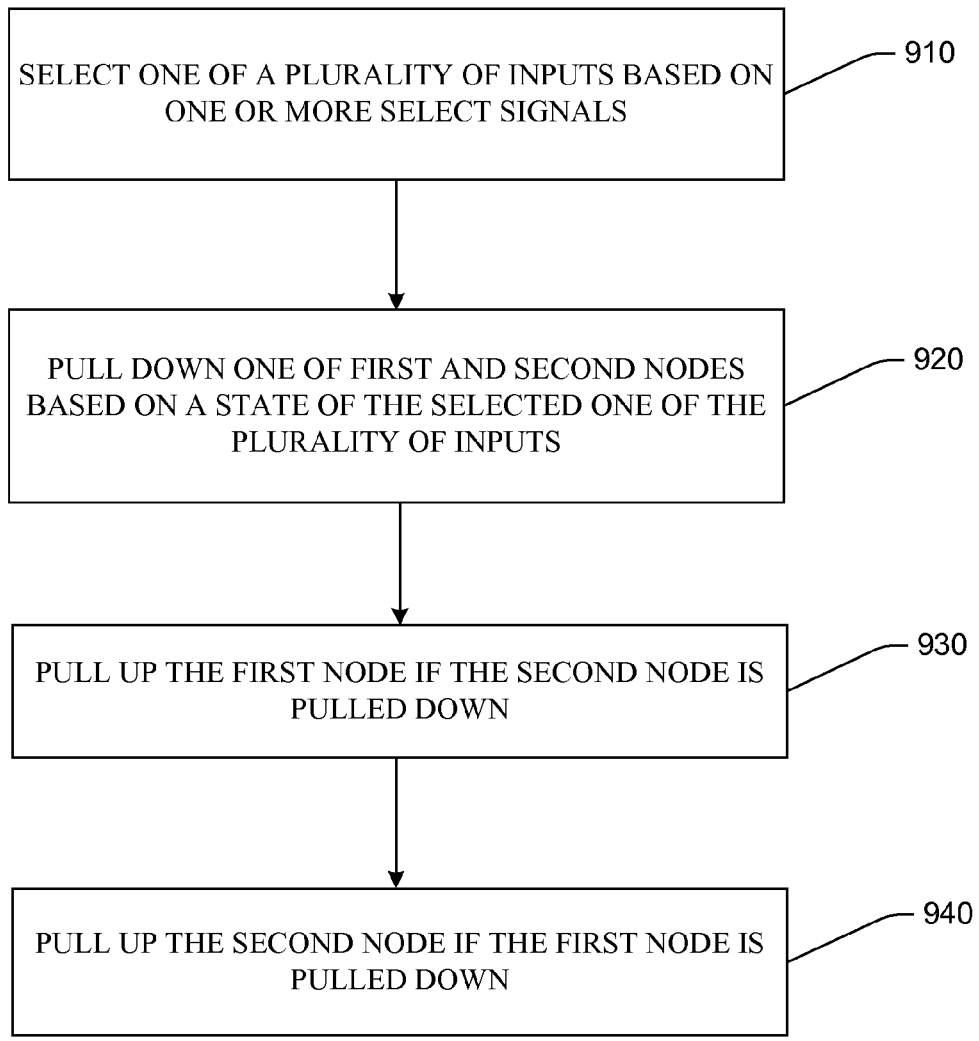
FIG. 9 is a flowchart of a method for level-shifting multiplexing according to an embodiment of the present disclosure.

FIG. 9 is a flowchart illustrating a method 900 for level-shifting multiplexing according to an embodiment of the present disclosure. The method 900 may be performed by the level-shifting multiplexer 410, 470 or 810.

In step 910, one of a plurality of inputs is selected based on one or more select signals. For example, each one of the plurality of inputs may be a differential input (e.g., first differential input) comprising a pair of complementary inputs (e.g., inputs A and $\overline{A}$ for the first differential input). In one example, the one or more select signals may comprise a respective select signal for each one of the plurality of inputs (e.g., select signal Sel A for the first differential input). In this example, one of the plurality of inputs may be selected when the respective select signal is logic one. The select signals for the unselected inputs may be logic zero.

In step 920, one of first and second nodes is pulled down based on a state of the selected one of the plurality of inputs.

For example, each of the plurality of inputs may be a differential input and the selected one of the plurality of inputs may be driven by a respective differential signal comprising complementary signals (e.g., signals A and $\overline{A}$). In this example, the first node may be pulled down if the differential signal is in one state (e.g., signal A is logic one and signal $\overline{A}$ is logic zero) and the second node may be pulled down if the differential signal in another state (e.g., signal A is logic zero and signal $\overline{A}$ is logic one).

In step 930, the first node is pulled up if the second node is pulled down. For example, the first node (e.g., node 460) may be pulled up by a PMOS transistor (e.g., PMOS transistor 415) having a gate coupled to the second node (e.g., node 465).

In step 940, the second node is pulled up if the first node is pulled down. For example, the second node (e.g., node 465) may be pulled up by a PMOS transistor (e.g., PMOS transistor 417) having a gate coupled to the first node (e.g., node 460).

Although embodiments of the present disclosure were discussed using the example of differential input signals, it is to be appreciated that the present disclosure is not limited to differential signals. For example, signal-ended signals may be input to the multiplexer 410 in FIG. 4A. In this example, complements of the signal-ended signals may be generated by inverters in the first power domain and the resulting complement signals may be input the multiplexer 410. Further, it is to be appreciated that each of the multiplexers 410, 510, 610 and 650 in FIGS. 5-7 may also include a multiplexing choke circuit to extend the range of supply voltages over which the multiplexers may operate.

The read decoder 530 or 630 may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A level-shifting multiplexer, comprising:
   a first pull-down circuit coupled to a first node and having first and second branches, wherein the first pull-down circuit is configured to pull-down the first node via the first branch in response to a first input driven to a first state and a first select signal being at a second state, and configured to pull down the first node via the second branch in response to a second input driven to a third state and a second select signal being at a fourth state;
   a second pull-down circuit coupled to a second node and having third and fourth branches, wherein the second pull-down circuit is configured to pull-down the second node via the third branch in response to a third input driven to a fifth state and the first select signal being at the second state, and configured to pull down the second node via the fourth branch in response to a fourth input driven to a sixth state and the second select signal being at the fourth state; and a pull-up circuit configured to pull up the first node if the second node is pulled down by the second pull-down circuit, and to pull up the second node if the first node is pulled down by the first pull-down circuit.

2. The level-shifting multiplexer of claim 1, wherein each of the first, third, fifth, and sixth states is a logic one state.

3. The level-shifting multiplexer of claim 2, wherein the first and third inputs are driven by a first pair of complementary signals, and the second and fourth inputs are driven by a second pair of complementary signals.

4. The level-shifting multiplexer of claim 1, wherein the pull-up circuit comprises:

a first transistor configured to pull up the first node if the second node is pulled down by the second pull-down circuit, wherein the first transistor has a gate coupled to the second node; and a second transistor configured to pull up the second node if the first node is pulled down by the first pull-down circuit, wherein the second transistor has a gate coupled to the first node.

5. The level-shifting multiplexer of claim 4, wherein the first and second transistors comprise cross-coupled p-type metal-oxide-semiconductor (PMOS) transistors.

6. The level-shifting multiplexer of claim 4, further comprising a choke circuit configured to reduce current from a supply rail to the first transistor if the first input is driven to the first state and the first select signal is at the second state.

7. The level-shifting multiplexer of claim 6, wherein the choke circuit is configured to reduce current from the supply rail to the first transistor if the second input is driven to the third state and the second select signal is at the fourth state.

8. The level-shifting multiplexer of claim 6, wherein the choke circuit is configured to reduce current from the supply rail to the second transistor if the third input is driven to the fifth state and the first select signal is at the second state.

9. The level-shifting multiplexer of claim 1, further comprising a clamp transistor coupled between the second node and a ground, wherein the clamp transistor is configured to turn on if a disable signal is in a logic one state.

10. The level-shifting multiplexer of claim 1, wherein:

the first branch comprises first and second transistors coupled in series between the first node and ground, wherein the first transistor includes a control terminal configured to receive the first select signal, and wherein the first input comprises a control terminal of the second transistor;

the second branch comprises third and fourth transistors coupled in series between the first node and ground, wherein the third transistor includes a control terminal configured to receive the second select signal, and wherein the second input comprises a control terminal of the fourth transistor;

the third branch comprises fifth and sixth transistors coupled in series between the second node and ground, wherein the fifth transistor includes a control terminal configured to receive the first select signal, and wherein the third input comprises a control terminal of the sixth transistor; and the fourth branch comprises seventh and eighth transistors coupled in series between the second node and ground, wherein the seventh transistor includes a control terminal configured to receive the second select signal, and wherein the fourth input comprises a control terminal of the eighth transistor.

11. The level-shifting multiplexer of claim 1, wherein the first and second select signals are complementary signals.

12. A method for level-shifting multiplexing, comprising:
receiving first and second select signals;
receiving first, second, third, and fourth input signals;
pulling down a first node via a first branch based on the first select signal and the first input signal;
pulling down the first node via a second branch based on the second select signal and the second input signal;
pulling down a second node via a third branch based on the first select signal and the third input signal;
pulling down the second node via a fourth branch based on the second select signal and the fourth input signal;
pulling up the first node if the second node is pulled down; and
pulling up the second node if the first node is pulled down.

13. The method of claim 12, wherein each of the first and third input signals, and the second and fourth input signals comprises a differential input signal.

14. The method of claim 13, wherein pulling up the first node if the second node is pulled down comprises pulling up the first node to a first voltage, wherein the first and third input signals or the second and fourth input signals comprises a differential signal having a voltage swing approximately equal to a second voltage and the first voltage is greater than the second voltage.

15. The method of claim 12, wherein pulling up the first node if the second node is pulled down comprises pulling up the first node using a first transistor coupled between a supply rail and the first node, and pulling up the second node if the first node is pulled down comprises pulling up the second node using a second transistor coupled between the supply rail and the second node.

16. The method of claim 15, further comprising choking current from the supply rail to the first transistor if the first node is pulled down.

17. The method of claim 16, further comprising choking current from the supply rail to the second transistor if the second node is pulled down.

18. The method of claim 12, wherein:

the first branch comprises first and second transistors coupled in series between the first node and ground, and wherein pulling down the first node via the first branch comprises applying the first select signal and the first input signal to control terminals of the first and second transistors, respectively;

the second branch comprises third and fourth transistors coupled in series between the first node and ground, and wherein pulling down the first node via the second branch comprises applying the second select signal and the second input signal to control terminals of the third and fourth transistors, respectively;

the third branch comprises fifth and sixth transistors coupled in series between the second node and ground, and wherein pulling down the second node via the third branch comprises applying the first select signal and the third input signal to control terminals of the fifth and sixth transistors, respectively; and the fourth branch comprises seventh and eighth transistors coupled in series between the second node and ground, and wherein pulling down the second node via the fourth branch comprises applying the second select signal and the fourth input signal to control terminals of the seventh and eighth transistors, respectively.

19. The method of claim 12, wherein the first and second select signals are complementary signals.

20. An apparatus for level-shifting multiplexing, comprising:
- means for receiving first and second select signals;
- means for receiving first, second, third, and fourth input signals;
- means for pulling down a first node via a first branch based on the first select signal and the first input signal;
- means for pulling down the first node via a second branch based on the second select signal and the second input signal;
- means for pulling down a second node via a third branch based on the first select signal and the third input signal;
- means for pulling down the second node via a fourth branch based on the second select signal and the fourth input signal;
- means for pulling up the first node if the second node is pulled down; and
- means for pulling up the second node if the first node is pulled down.

21. The apparatus of claim 20, wherein each of the first and third input signals, and the second and fourth input signals comprises a differential input.

22. The apparatus of claim 21, wherein the means for pulling up the first node if the second node is pulled down comprises means for pulling up the first node to a first voltage, wherein the first and third input signals or the second and fourth input signals comprises a differential signal having a voltage swing approximately equal to a second voltage and the first voltage is greater than the second voltage.

23. The apparatus of claim 20, wherein the means for pulling up the first node if the second node is pulled down comprises means for pulling up the first node using a first transistor coupled between a supply rail and the first node, and the means for pulling up the second node if the first node is pulled down comprises means for pulling up the second node using a second transistor coupled between the supply rail and the second node.

24. The apparatus of claim 23, further comprising means for choking current from the supply rail to the first transistor if the first node is pulled down.

25. The apparatus of claim 24, further comprising means for choking current from the supply rail to the second transistor if the second node is pulled down.

26. The apparatus of claim 20, wherein:
- the first branch comprises first and second transistors coupled in series between the first node and ground, and wherein the means for pulling down the first node via the first branch comprises means for applying the first select signal and the first input signal to control terminals of the first and second transistors, respectively;
- the second branch comprises third and fourth transistors coupled in series between the first node and ground, and wherein the means for pulling down the first node via the second branch comprises means for applying the second select signal and the second input signal to control terminals of the third and fourth transistors, respectively;
- the third branch comprises fifth and sixth transistors coupled in series between the second node and ground, and wherein the means for pulling down the second node via the third branch comprises means for applying the first select signal and the third input signal to control terminals of the fifth and sixth transistors, respectively; and
- the fourth branch comprises seventh and eighth transistors coupled in series between the second node and ground, and wherein the means for pulling down the second node via the fourth branch comprises means for applying the second select signal and the fourth input signal to control terminals of the seventh and eighth transistors, respectively.

27. The apparatus of claim 20, wherein the first and second select signals are complementary signals.

* * * * *